United States Patent
Crawford et al.

(10) Patent No.: US 10,454,250 B2
(45) Date of Patent: Oct. 22, 2019

(54) THERMAL CONTACT FOR SEMICONDUCTORS AND RELATED METHODS

(71) Applicant: LASERTEL INC., Tucson, AZ (US)

(72) Inventors: Devin Earl Crawford, Holzkirchen (DE); Prabhu Thiagarajan, Tucson, AZ (US)

(73) Assignee: LASERTEL INC., Tucson, AZ (US)

( * ) Notice: Subject to any disclaimer, the term of this patent is extended or adjusted under 35 U.S.C. 154(b) by 0 days.

(21) Appl. No.: 15/601,820

(22) Filed: May 22, 2017

(65) Prior Publication Data

US 2018/0337513 A1 Nov. 22, 2018

(51) Int. Cl.
*H01S 5/30* (2006.01)
*H01S 5/024* (2006.01)
*H01S 5/026* (2006.01)
*H01S 5/20* (2006.01)
*H01S 5/042* (2006.01)
*H01S 5/22* (2006.01)
*H01S 5/223* (2006.01)

(52) U.S. Cl.
CPC ............ *H01S 5/3095* (2013.01); *H01S 5/026* (2013.01); *H01S 5/02469* (2013.01); *H01S 5/0421* (2013.01); *H01S 5/2086* (2013.01); *H01S 5/3054* (2013.01); *H01S 5/0425* (2013.01); *H01S 5/2214* (2013.01); *H01S 5/2231* (2013.01)

(58) Field of Classification Search
CPC .... H01S 5/3095; H01S 5/3054; H01S 5/0421; H01S 5/026; H01S 5/02469; H01S 5/2086
See application file for complete search history.

(56) References Cited

U.S. PATENT DOCUMENTS

| | | | |
|---|---|---|---|
| 5,212,706 A | 5/1993 | Jain | B82Y 20/00 |
| 6,865,200 B2 | 3/2005 | Takigawa et al. | 372/35 |
| 7,660,335 B2 | 2/2010 | Thiagarajan et al. | 372/34 |
| 8,017,935 B2 | 9/2011 | Staszewski et al. | 257/27 |
| 2002/0014631 A1* | 2/2002 | Iwata | H01L 33/26 257/89 |
| 2002/0086483 A1 | 7/2002 | Kim | 438/264 |
| 2003/0116767 A1 | 6/2003 | Kneissl et al. | 257/79 |

(Continued)

FOREIGN PATENT DOCUMENTS

JP 2002111058 A * 4/2002 ............. H01L 33/00

OTHER PUBLICATIONS

Giri et al, "Influence of Hot Electron Scattering and Electron-Phonon Interactions on Thermal Boundary Conductance at Metal/Nonmetal Interfaces" Journal of Heat Transfer, vol. 136, dated Sep. 2014 (6 pgs).

Martin et al., "Thermal Behavior of Visible AlGaInP—GaInP Ridge Laser Diodes" IEEE Journal of Quantum Electronics, vol. 28, No. 11, dated Nov. 1992 (7 pgs).

(Continued)

*Primary Examiner* — Yuanda Zhang
(74) *Attorney, Agent, or Firm* — Hayes Soloway PC (57) ABSTRACT

A semiconductor apparatus with improved heat removal and improved heat flow to a heat sink is provided. The semiconductor apparatus includes a p-type semiconductor. An n-p tunnel junction is positioned within an epitaxial structure of the p-type semiconductor. A metal contact layer is connected to the n-p tunnel junction through an alloyed n-type contact interface. The n-p tunnel junction improves heat flow from the semiconductor through an alloyed contact interface formed between the tunnel junction and the metal contact layer which has lower thermal and electrical resistance in comparison to a conventional metallurgically abrupt interface of a p-type contact.

12 Claims, 10 Drawing Sheets

(56) References Cited

U.S. PATENT DOCUMENTS

| | | | |
|---|---|---|---|
| 2006/0011938 A1 | 1/2006 | Debray | 257/104 |
| 2008/0213710 A1 | 9/2008 | Schultz | F23N 1/027 |
| 2008/0259983 A1 | 10/2008 | Trococoli | 372/6 |
| 2009/0090932 A1 | 4/2009 | Bour et al. | 257/103 |
| 2010/0012188 A1* | 1/2010 | Garnett | H01L 31/02966 |
| | | | 136/260 |
| 2011/0103409 A1 | 5/2011 | Sipes | G02B 6/4296 |
| 2012/0114001 A1 | 5/2012 | Fang et al. | 372/45.01 |
| 2012/0153254 A1* | 6/2012 | Mastro | H01L 33/40 |
| | | | 257/13 |
| 2012/0252144 A1* | 10/2012 | Schroeder | H01S 5/02264 |
| | | | 438/26 |
| 2015/0162478 A1 | 6/2015 | Fafard | 257/461 |

OTHER PUBLICATIONS

Monachon, C., "Thermal Boundary Conductance Between Metals and Dielectrics" thesis for the graduation of Doctor of Science, Federal Institute of Technology in Lausanne, 2013 (251 pgs).

Rieprich et al., "Assessment of Factors Regulating the Thermal Lens Profile and Lateral Brightness in High Power Diode Lasers" Proc of SPIE, vol. 10085, No. 1008502-1, dated 2017 (10 pgs).

Zhang et al., "Thermal Transport Across Metal-Insulator Interface Via Electron-Phonon Interaction," Journal of Physics Condensed Matter, dated Oct. 2013 (15 pgs).

Office Action issued in U.S. Appl. No. 15/363,874, dated Apr. 24, 2018 (10 pgs).

European Search Report issued in application No. 18173282.7-1211, dated Oct. 8, 2018 (9 pgs).

Feng, et al., "High efficient GaN-based laser diodes with tunnel junction", Applied Physics Letters 103, AIP Publishing, LLC, 2013.

Rieprich, et al., "Proceedings of SPIE—Assessment of factors regulating the thermal lens profile and lateral brightness in high power diode lasers", SPIEL ASE, 2017.

U.S. Official Action for related U.S. Appl. No. 15/363,874, dated Feb. 14, 2019 (13 pgs).

* cited by examiner

THERMAL CONTACT FOR SEMICONDUCTORS AND RELATED METHODS

FIELD OF THE DISCLOSURE

The present disclosure is generally related to improved heat removal from high power optical semiconductor devices and more particularly is related to improved heat flow from the semiconductor to the heat sink.

BACKGROUND OF THE DISCLOSURE

Semiconductor technology provides a platform to achieve efficient, compact high power optical sources. High power light emitting semiconductor devices such as light emitting diodes (LEDs) and laser diodes (LDs) are widely used sources of optical power. Although these devices are comparatively efficient, heat generation occurs in a very small volume. For example, high power laser diode bars can generate over 50 Watts of optical power in a volume less than 5 mm$^3$. Electrical to optical conversion efficiency may approach 70% in which case over 3 kW of heat is generated per cubic centimeter. Heat is generally removed by operating the devices on submounts having high electrical and thermal conductivity. The submount, in turn, is placed in direct contact to a cooled heat sink. The submount serves as both an electrical and thermal conduit. Because the contact area of the device is small, the interface between the submount and semiconductor can be a crucial link in the thermal path.

Several patents and publications have been directed to heat removal from semiconductor laser diodes. See, for example, U.S. Pat. Nos. 7,660,335 and 6,865,200, and U.S. Patent Publication No. 2012/0252144. These disclosures facilitate heat removal by placing a thermally and electrically conducting material, i.e., a heat sink, in direct contact to the semiconductor surface. Low thermal and electrical resistance is achieved by soldering the heat sink to the diode with appropriately chosen solder alloys to minimize stress and improve thermal performance. Optical alignment, packaging, and assembly are other considerations addressed by these disclosures and other publications (see, for example, Martin, et al., IEEE J. Quantum Electr. Vol. 28, N. 11, 1992).

Figure 1:
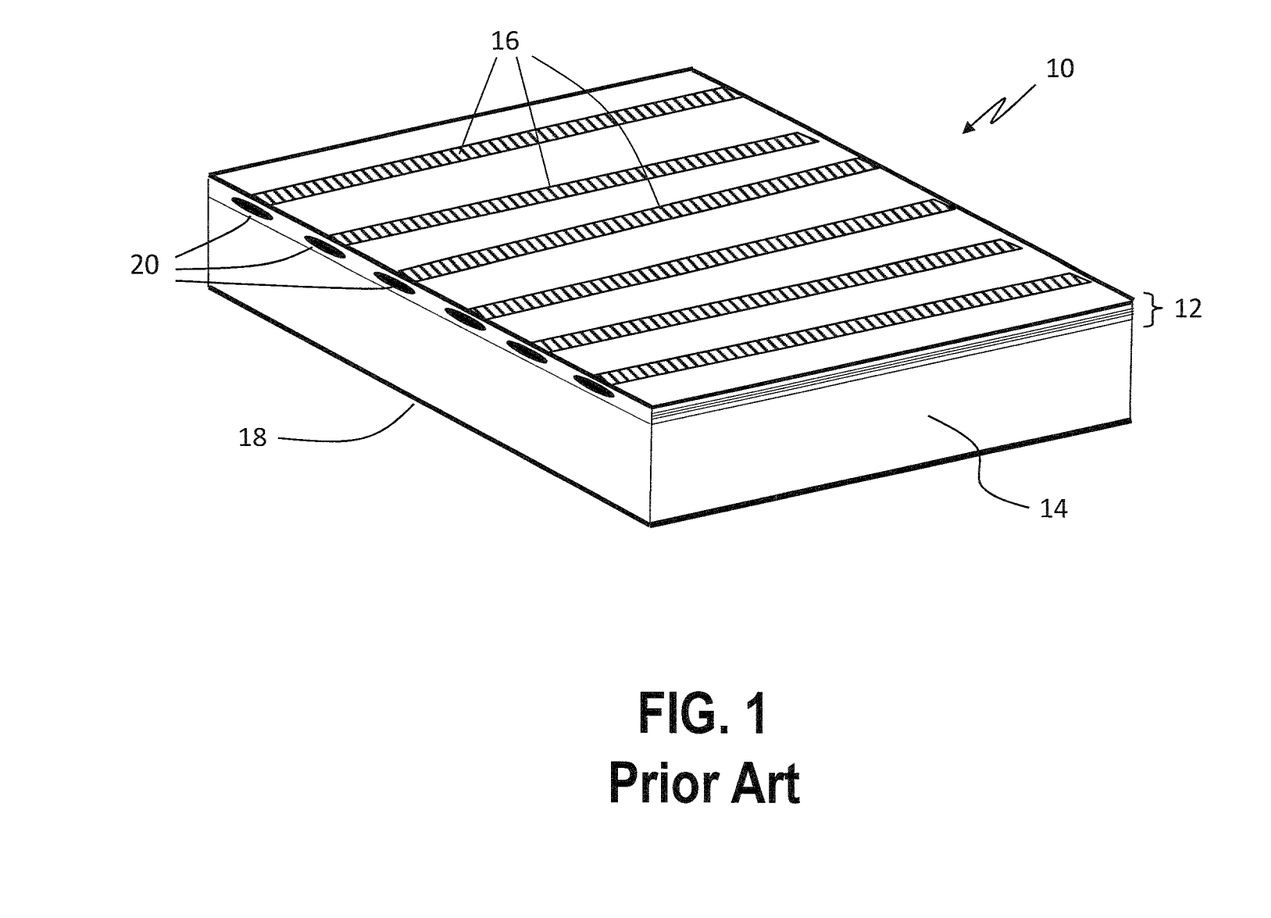
FIG. 1 is a schematic diagram of an edge emitting laser diode bar with multiple emitters representative of the current state of the art, in accordance with the prior art.
Figure 2:
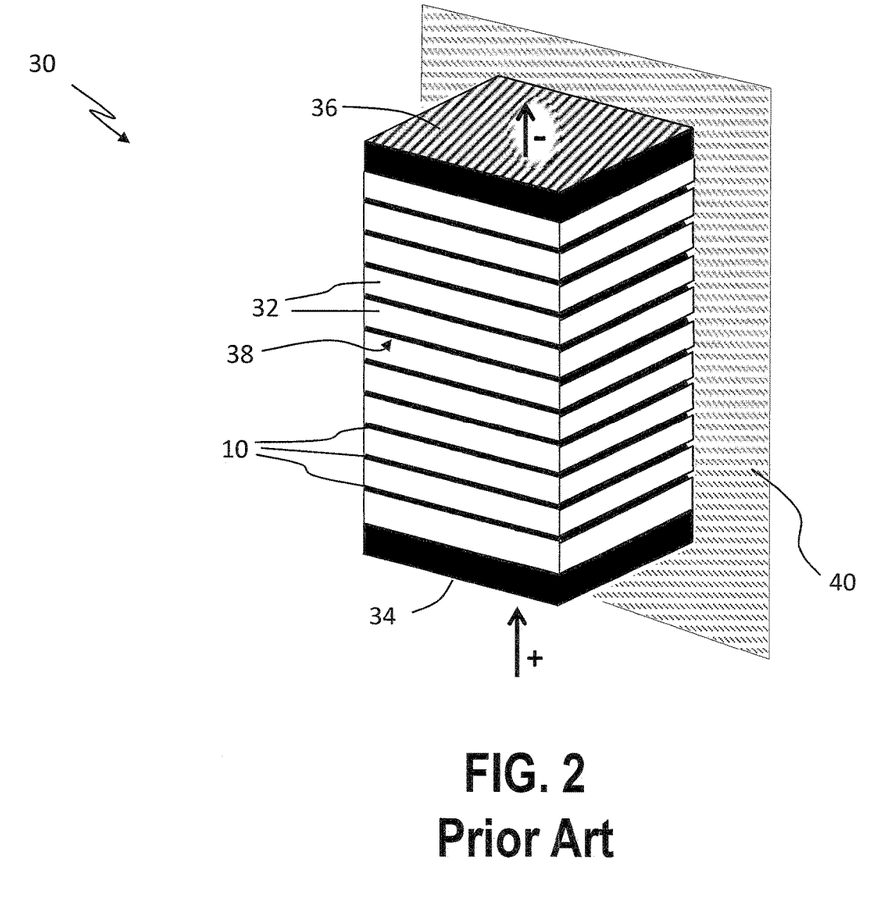
FIG. 2 is a schematic diagram of a laser diode array consisting of stacked laser diode bars from FIG. 1 connected in series by thermally and electrically conducting spacers, in accordance with the prior art.
Figure 3:
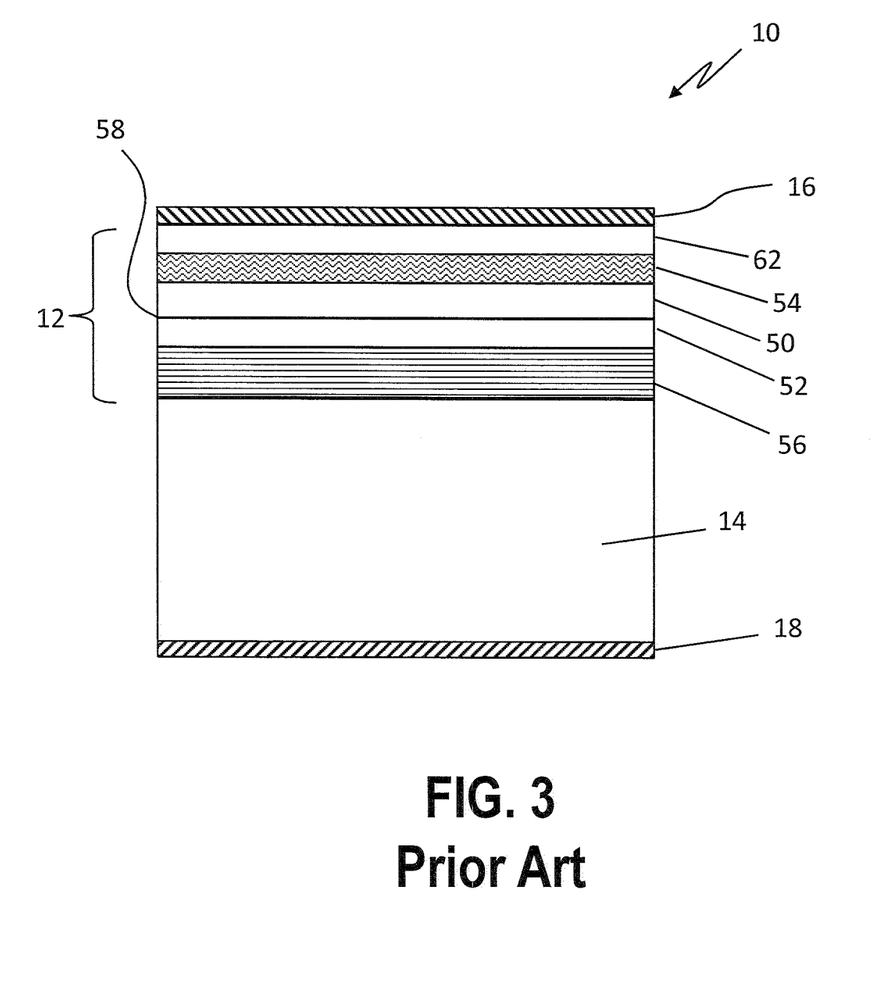
FIG. 3 is a detailed schematic diagram of epitaxial semiconductor layers that comprise laser diode bars of FIG. 1, in accordance with the prior art.
Figure 4:
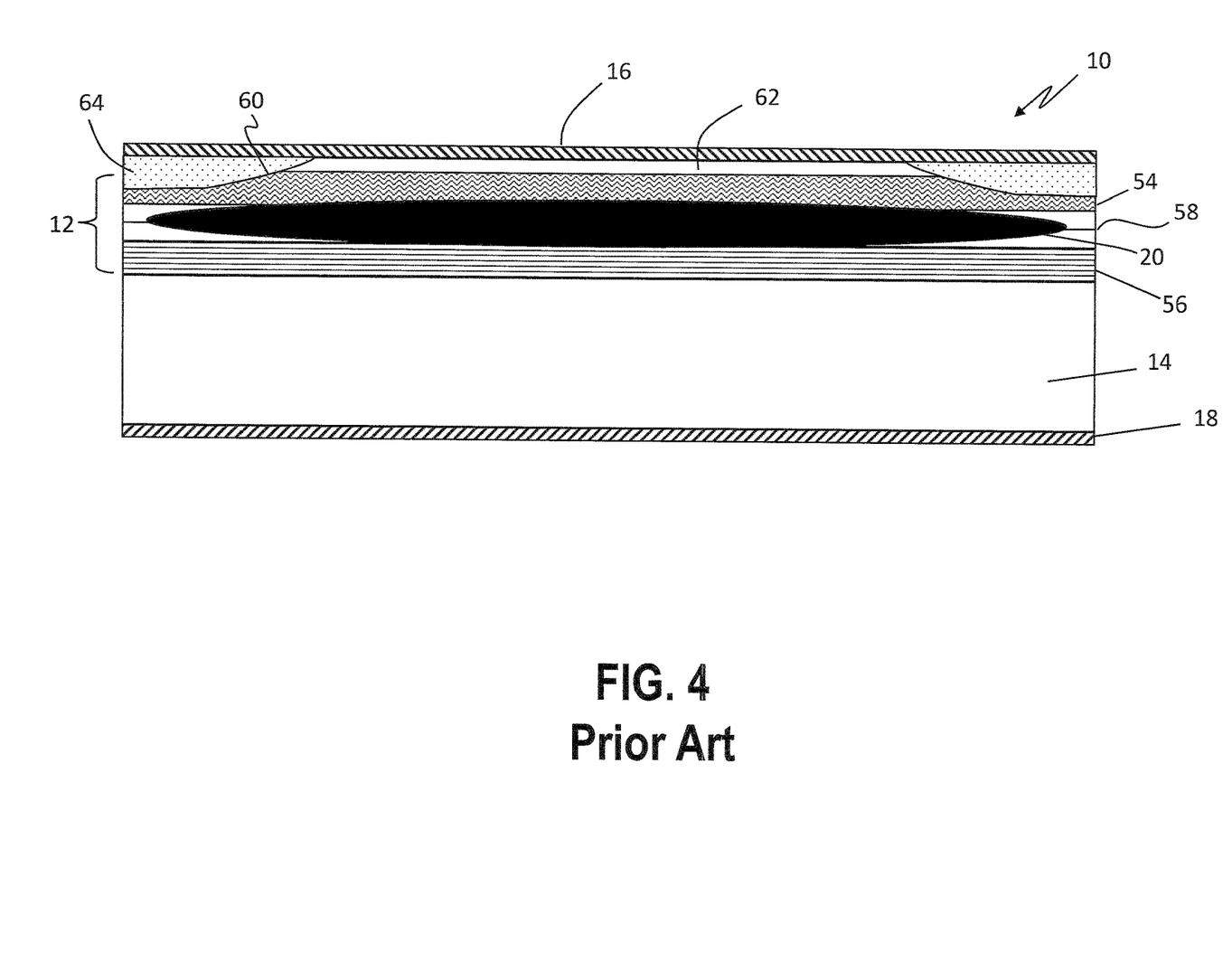
FIG. 4 is a schematic diagram of a single laser diode emitter depicting epitaxial layers in the laser diode along with the contact and features defining the lateral waveguide, in accordance with the prior art.

The current state of thermal transfer in conventional laser diodes can be further understood from FIGS. 1-6. FIG. 1 is a schematic diagram of an edge emitting laser diode bar 10 with multiple emitters representative of the current state of the art, in accordance with the prior art. The laser diode bar 10 is comprised of semiconductor layers 12 that are typically grown by epitaxy on a single crystal semiconductor substrate 14. The substrate 14 is typically composed of either gallium arsenide (GaAs) or indium phosphide (InP). The laser diode 10 operates when electrical current flows from the p-type contacts 16 to the n-type contact 18. Both p-type and n-type contacts 16, 18 are comprised of multiple metal layers deposited using well established deposition techniques such as sputtering or electron beam evaporation. Thicker metal may be added to one or more of the p-type and n-type contacts 16, 18 by electrochemical deposition to improve lateral heat spreading and to protect the metal/semiconductor interface from possible handling damage (i.e. scratches). The pattern for the p-type contacts 16 shown in FIG. 1 is defined using standard photolithographic processes. FIG. 1 shows individual strips of the p-type contacts 16 on the p-type side of the laser diode 10, which depicts how multiple light emitters for emitting coherent light 20 are integrated in a single chip. However, in practice the metal of the p-type contacts 16 could cover the entire surface of the p-type side of the laser diode 10 and the current flow could be defined by etching a window through an insulating layer, as shown in FIG. 4. Some conventional laser diodes 10 may also isolate emitters using further etch and deposition processes or ion implantation to reduce electrical connectivity in regions of the p-type semiconductor to confine the current.

Laser diode assemblies are used to achieve very high optical power density in a compact form factor. FIG. 2 is a schematic diagram of a laser diode array 30 consisting of stacked laser diode bars 10 from FIG. 1 connected in series by thermally and electrically conducting spacers, in accordance with the prior art. The laser diode array 30 has diode bars 10 that are stacked vertically and separated by spacers 32. Electrical current flows from the positive contact 34 to the negative contact 36. The laser light (20 in FIG. 1) is emitted out the front facets 38 of the diode bars 10. Additional optical components that are not shown may be used to collect, focus, and/or collimate the light. This configuration requires that the electrical resistance be as low as possible since resistive loss generates excess heat. Therefore, it is important that the spacers 32 exhibit good electrical conductivity. Additionally, the spacers 32 conduct heat from the laser diode bars 10 to the cooled heat sink 40 so they must also exhibit high thermal conductivity. Heat is generated inside the laser diode bars 10 near the active region so the heat transfer through the p-contact(s) (16 in FIG. 1) can play a crucial role in device performance and reliability.

FIG. 3 is a detailed schematic diagram of epitaxial semiconductor layers 12 that comprise laser diode bars 10 of FIG. 1, in accordance with the prior art. The vertical waveguide for the laser diode 10 is formed by growing waveguide layers 50, 52 that have larger refractive index than the surrounding p-type cladding layer 54 and n-type cladding layer 56. The electrical current injected from the cladding layers 54, 56 is converted to coherent optical power in the active layer 58 positioned between the waveguide layers 50, 52.

FIG. 4 is a schematic diagram of a single laser diode emitter depicting epitaxial layers in the laser diode along with the contact and features defining the lateral waveguide, in accordance with the prior art. With reference to FIGS. 3-4, lasing operation requires that light generated in the active region 58 be guided in both the vertical and lateral dimensions. Lateral guiding can be achieved by limiting the lateral extent of the current flow as indicated in FIG. 4 by etching a mesa 60 into the semiconductor. Coherent light 20 is emitted from the laser diode 10 on a facet plane (illustrated perpendicular to the cross-section shown in FIGS. 3-4; 16 in FIG. 2). Emission intensity is controlled by controlling the reflectivity at the facet by means of mirror coating layers. Laser light is primarily emitted from the facet with low reflectivity.

Resistive loss is an important heat source in the laser diode. The substrate 14 is typically polished after growth of the epitaxial layers, thereby reducing the thickness on the n-side, which also reduces the electrical and thermal resistance between the active region 58 and the n-side contact 18. The final thickness after polishing is limited by the requirement that the laser diode 10 retain mechanical stability for subsequent handling. The electrical resistivity of the p-type semiconductor material is generally higher than that of the n-type material. Therefore, the diode 10 is designed so the p-type cladding layer 54 and the p-type cap layer 62 are as thin as possible, on the order of 1-2 µm. The p-type clad layer 54 must be thick enough to guide the coherent light in the waveguide layers 50, 52, 58 but thin enough to minimize series resistance on the p-side of the diode 10. The thermal resistance on the p-side of the diode 10 can also be improved if the p-type layers 54, 62 are as thin as possible. Electrical resistance at the p-type contact can be further reduced by growing a thin, highly doped cap layer 62 on the p-type cladding layer 54 to which the metal contact 16 is contacted. When possible, the cap layer 62 is chosen to have a small bandgap which reduces the electrical Schottky barrier to the metal contact 16. The p-type resistivity, contact to the metal contact 16 and the reduction of the Schottky barrier height at the p-type contact 16 are important considerations to minimize heating on the p-side of the laser diode 10.

FIG. 4 further shows the cross-section of the edge emitting laser diode 10 in which the lateral waveguide is defined by an etched mesa 60 using standard wet chemical processing and photolithography. An electrically insulating layer 64 helps confine the current to the lateral waveguide, thereby improving electrical to optical conversion efficiency. The mesa structure 60 also guides the optical power 20 which facilitates coupling of the emitted light at the output facet and improves electrical to optical conversion efficiency. The insulating layer 64 typically has lower thermal conductivity than the semiconductor 12 and metal contact 16 so heat flows predominantly through the p-type contact 16. Heat transport through the interface between the p-type contact 16 and p-type semiconductor 12 is consequently of great importance for device performance.

Figure 5:
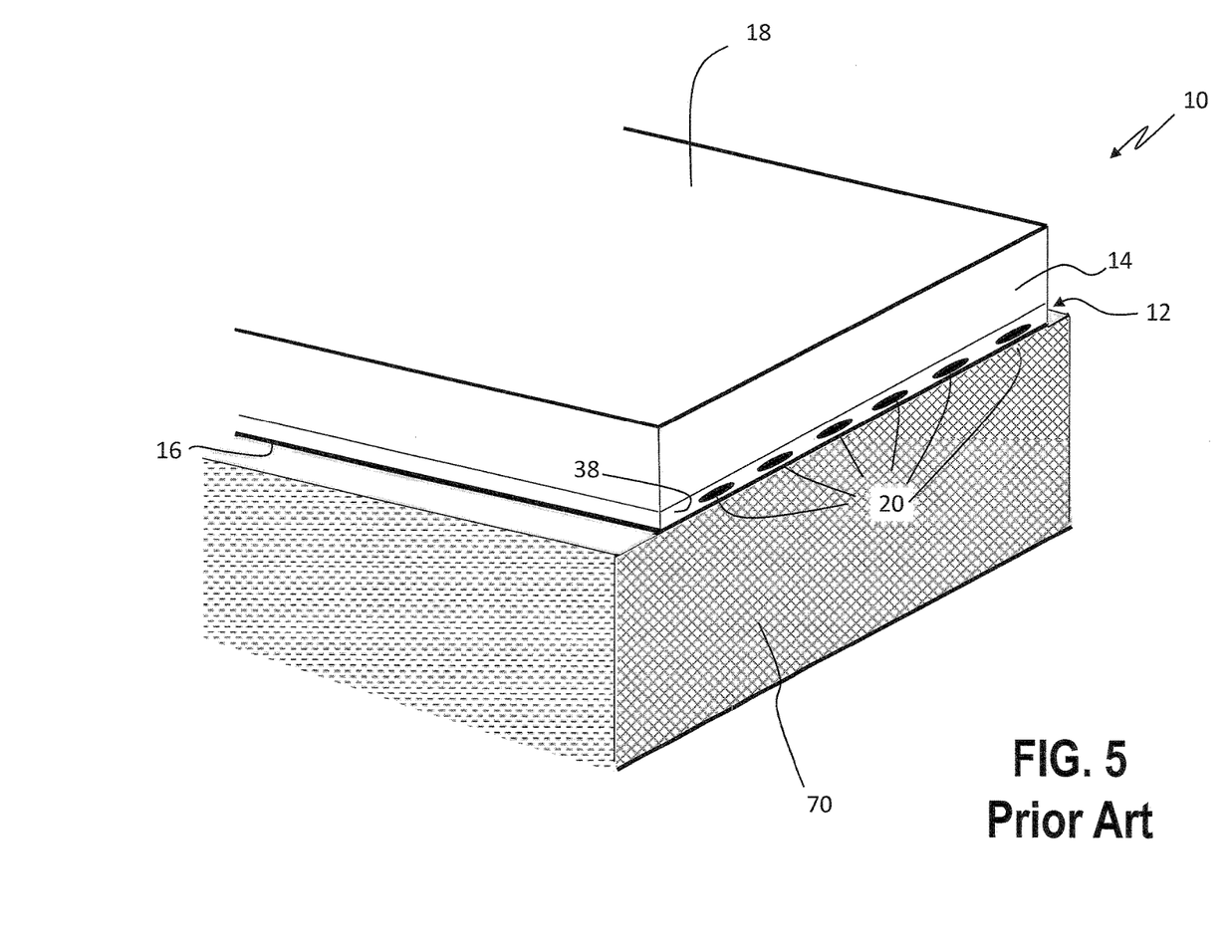
FIG. 5 is a schematic diagram of a laser diode bar with the p-side mounted to a thermally and electrically conducting spacer, in accordance with the prior art.

FIG. 5 is a schematic diagram of a laser diode bar 10 with the p-side mounted to a thermally and electrically conducting spacer 70, in accordance with the prior art. Multiple waveguides 12 defined laterally along the width of the laser diode emit light 20 that is transmitted from the low-reflectivity laser facet 38. Heat removal from the laser diode 10 through the p-type contact 16 is facilitated by minimizing the distance from the laser diode active 12 region to the p-type contact 16 and spacer 70.

Figure 6:
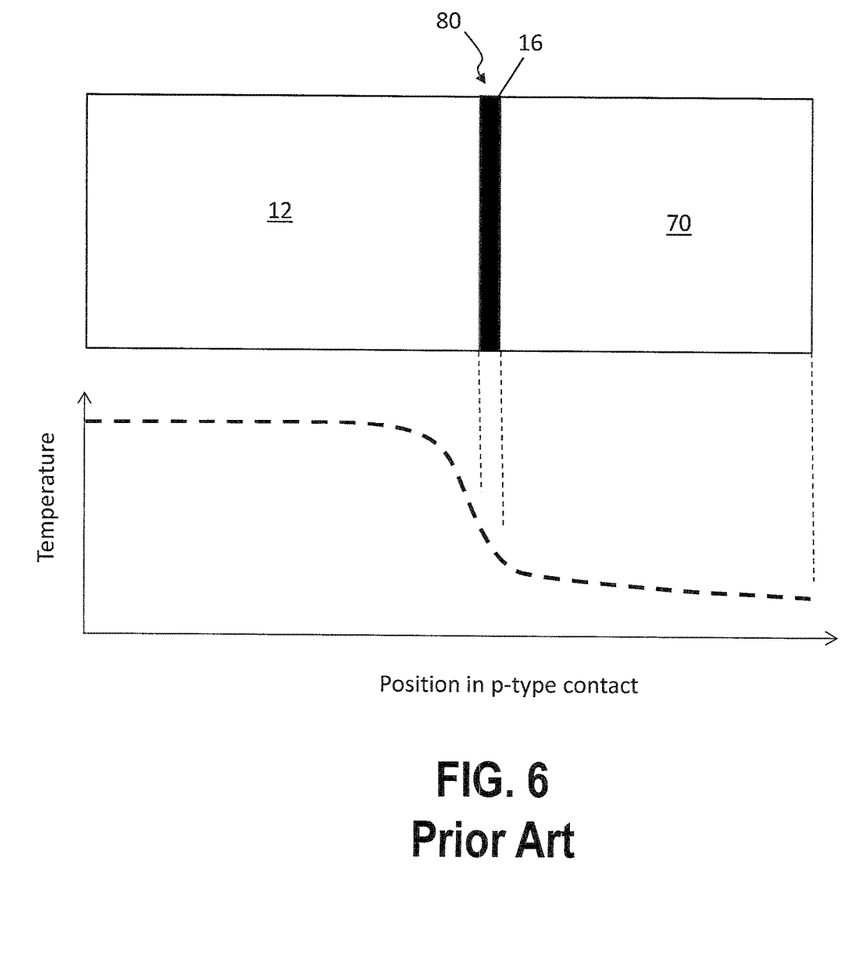
FIG. 6 depicts a corresponding temperature profile at the p-type contact with the thermal barrier, in accordance with the prior art.

The thermal barrier at the p-type contact 16 poses a fundamental limit on the removal of heat through the p-type contact 16. FIG. 6 depicts a corresponding temperature profile at the p-type contact 16 with the thermal barrier, in accordance with the prior art, and as noted by Rieprich, et al. (Proc. SPIE, Vol. 10085, N. 1008502, 2017). As shown in FIG. 6, the temperature in the semiconductor 12 changes linearly and may even increase at the portion of the semiconductor 12 positioned near or approaching the p-type contact 16 due to significant heat generation occurring in the p-type semiconductor 12. An abrupt temperature change occurs at the interface 80 of the p-type contact 16 with the metal spacer 70 due to the thermal barrier, such that the temperature decreases in the metal spacer 70 away from the interface 80.

Rieprich, et al. recently conducted a study which presented results from an investigation into thermal lensing in broad area edge emitting laser diodes. Thermal lensing occurs when the local refractive index in the laser diode waveguide increases due to heating. Multiple negative effects, including beam quality degradation, are attributed to thermal lensing. The authors showed that a thermal conductance barrier between the p-type semiconductor and metal contact, e.g., the barrier at interface 80 in FIG. 6, places a lower limit on thermal resistance. The thermal barrier was attributed to the fact that the heat transport mechanism in the semiconductor is different than that in the metal. The thermal barrier at interfaces between metals and non-metals was also described in a doctoral thesis entitled, "Thermal Boundary Conductance between metals and dielectrics" (École Polytechnique Fédérale De Lausanne, Faculté Des Sciences Et Techniques De L'Ingeniuer, 2013). Heat transport in metals is dominated by electron transport while heat transport in non-metals is primarily due to phonon dispersion. The barrier is attributed to the transfer of thermal energy from one mechanism to the other. Rieprich et al. observed that the thermal barrier was common to multiple laser diodes from various suppliers. The thermal barrier was consistently in the range 0.12-0.19 Kelvin per $mm^2$ which is consistent with measurements performed by the inventors of this disclosure.

Thus, with this understanding of the present state of heat removal in conventional semiconductors, it is evident that improved heat removal and improved heat flow from semiconductors to a heat sink is needed to address the aforementioned deficiencies and inadequacies.

SUMMARY OF THE DISCLOSURE

Embodiments of the present disclosure provide a system and method for a semiconductor apparatus with improved heat removal from the semiconductor to the heat sink. Briefly described, in architecture, one embodiment of the semiconductor apparatus, among others, can be implemented as follows. The semiconductor apparatus has a p-type semiconductor. An n-p tunnel junction is positioned within an epitaxial structure of the p-type semiconductor. A metal contact layer is connected to the n-p tunnel junction through an alloyed n-type contact interface.

The present disclosure can also be viewed as providing a laser diode apparatus with improved heat removal from the epitaxial layers thereof to the heat sink. Briefly described, in architecture, one embodiment of the laser diode apparatus, among others, can be implemented as follows. The laser diode apparatus has n-type and p-type waveguide layers having an active layer therebetween. A tunnel junction is formed on a p-side of the n-type and p-type waveguide layers. A metal contact layer is in contact with the tunnel junction, wherein an alloyed contact interface is formed between the tunnel junction and the metal contact layer.

The present disclosure can also be viewed as providing methods of heat removal from a high powered semiconductor device. In this regard, one embodiment of such a method, among others, can be broadly summarized by the following steps: providing a p-type semiconductor having an n-p tunnel junction positioned within an epitaxial structure of the p-type semiconductor; injecting an electrical current through the p-type semiconductor, thereby generating heat within the p-type semiconductor; and transferring at least a portion of the generated heat from the p-type semiconductor, through the n-p tunnel junction, and to a metal contact layer formed on the n-p contact layer, wherein an alloyed contact interface is formed between the n-p tunnel junction and the metal contact layer.

Moreover, in further detail, embodiments of the present disclosure encompass high power semiconductor devices whose operation requires that electrical current flow from a p-type to an n-type semiconductor. Thermal resistance metal semiconductor interface is reduced by replacing the p-contact with an n-contact accompanied by a low resistance tunnel junction. Briefly described, in architecture, one embodiment, among others, can be implemented as a laser diode comprised of n-type and p-type layers on either side of intrinsic waveguide layers. The waveguide layers have higher refractive index than the adjacent cladding layers and therefore guide light in an optical cavity. An active layer in the waveguide provides optical gain by stimulated emission where injected electrical current is converted to coherent optical power. A tunnel junction on the p-type side of the laser diode forms a low resistance contact to an n-type layer. The electrical and thermal contact on the p-side of the laser diode is realized by making an alloyed contact to the n-type semiconductor adjacent to the tunnel junction, thereby reducing thermal and electrical resistance between the semiconductor and adjacent spacer or heatsink.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

With the understanding of the conventional heat removal and heat flow to a heat sink, as presented in the Background, the inventors of the present disclosure identified that the thermal barrier is a fundamental property of the p-contact interface. The thermal barrier was not, however, identified at the contact to the n-type semiconductor. The observed difference between n-type and p-type contacts is consistent with the fact that the n-type contact is comprised of a thin alloy layer at the semiconductor metal interface while the p-type contact is metallurgically abrupt. Accordingly, these findings demonstrate that thermal performance of high power semiconductor devices requiring both p-type and n-type contacts could be greatly improved if the thermal barrier at the p-type contact were reduced or eliminated. This disclosure describes devices and methods by which this thermal barrier can be eliminated, thereby reducing the thermal resistance for heat flow through the p-type contact leading to significantly improved performance and reliability.

In particular, to overcome the deficiencies of the conventional art, the subject disclosure provides devices and methods which utilize a tunnel junction as part of the epitaxial structure in high power semiconductor devices to improve cooling efficiency. Applications employing edge emitting laser diodes exemplify a scenario that benefits from improved cooling efficiency. Laser diode bars can be stacked to achieve very high optical power density in a compact, modular form factor, similar to the form shown in FIG. 2. Due to the very high power density significant heat is generated inside the laser diode bars. Performance and reliability rely on efficient removal of heat form the semiconductor, which is accomplished through the use of spacers placed between the laser diode bars which conduct heat to the heat sink.

Tunnel junctions are commonly used in solar cells to improve conversion efficiency by stacking multiple p-n junctions within the epitaxial layers between detectors. In accordance with the present disclosure, edge-emitting laser diodes require both p-type and n-type semiconductors. The inherent thermal boundary between the p-type semiconductor and metal poses a fundamental limit to the heat transport from the semiconductor, as described by Rieprich et al. The thermal barrier results from the heat transport mechanism transition from predominantly phonon propagation in the semiconductor to electron transport in the metal. The thermal barrier does not exist at the barrier between the n-type semiconductor and metal contact, most likely due to the fact that this transition consists of an alloy rather than a metallurgically abrupt interface as is the case for the p-type contact. The present disclosure eliminates the thermal barrier at the p-type contact by placing a tunnel junction between the p-type semiconductor and the contact, thereby replacing the abrupt interface between the metal and p-type semiconductor with the alloyed n-type contact.

Figure 7:
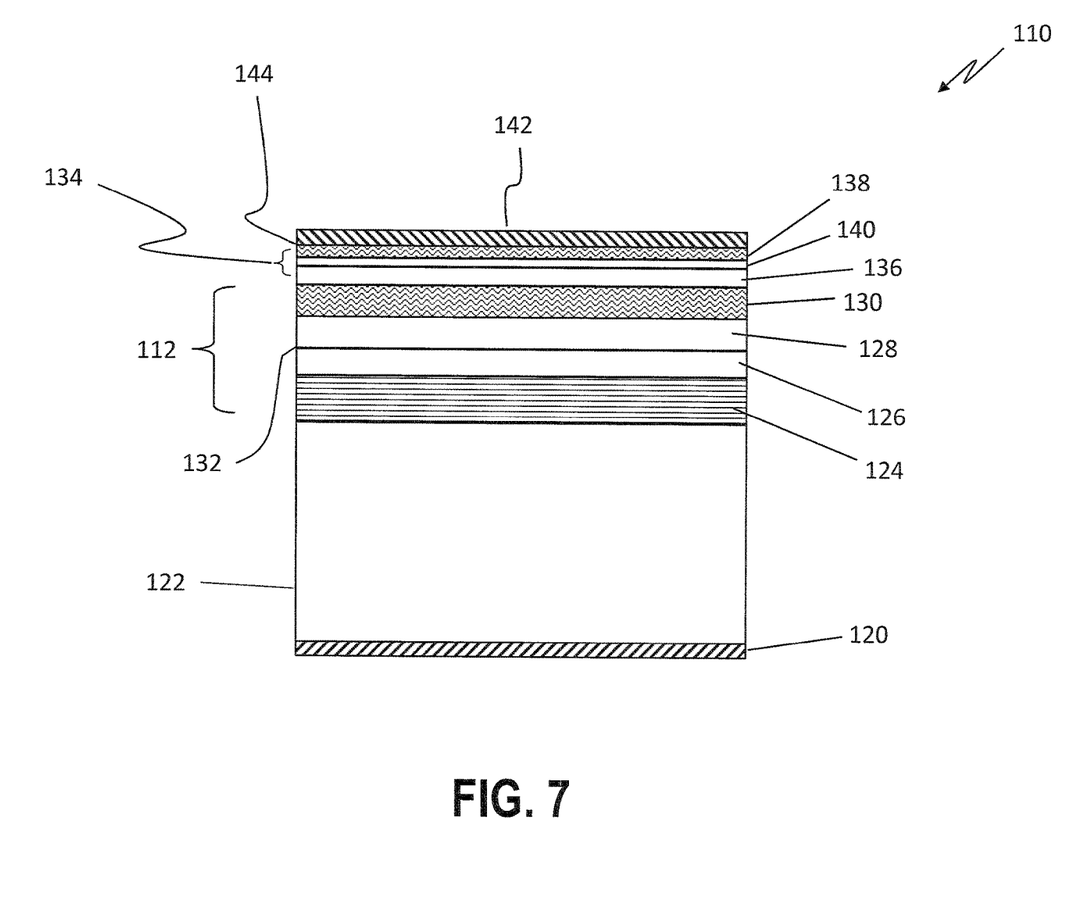
FIG. 7 is a detailed cross-sectional view diagram of a semiconductor implemented as a laser diode having a tunnel junction, in accordance with a first exemplary embodiment of the present disclosure.

FIG. 7 is a detailed cross-sectional view diagram of a semiconductor 110 implemented as a laser diode having a tunnel junction, in accordance with a first exemplary embodiment of the present disclosure. While the semiconductor 110 is shown in a laser diode implementation, the disclosed structure may be used for other types of semiconductors beyond laser diodes, such as for LEDs. As shown, the semiconductor 110 includes a metal contact 120 positioned in abutment with an n+ substrate 122. An n-type cladding layer 124 may be positioned on the n+ substrate 122. The vertical waveguide for the semiconductor 110 may be formed by growing the waveguide layers, n-guide layer 126 and p-guide layer 128, which have larger refractive index than the surrounding p-type cladding layer 130 and n-type cladding layer 124. The electrical current injected from the cladding layers 124, 130 is converted to coherent optical power in the active region 132 (quantum well) positioned between the n-guide and p-guide layers 124, 126.

In contrast to the use of a p-type cap layer abutting a metal contact in conventional semiconductors (e.g., p-type cap layer 62 and metal contact 16 in FIGS. 3-4 and 6), in the semiconductor 110 of the subject disclosure, the p-type contact is eliminated by placing a reverse biased tunnel junction 134 between a p-type semiconductor 136 and a heavily doped n-type semiconductor 138. Current transport between the p-type and n-type semiconductor 136, 138 through the reverse biased tunnel junction 134 is facilitated by placing a thin, very heavily doped p++ layer 140 having slightly lower bandgap than the adjacent p-type layer 136 next to a heavily doped, n++ layer 138. A metal contact 142 is located adjacent to the thin, very heavily doped p++ layer 140 such that a metal-to-n-semiconductor interface 144 is formed therebetween. The use of the reversed biased tunnel junction and the metal-to-n-semiconductor interface 144 replaces the abrupt interface between the conventional metal and p-type semiconductor with the alloyed n-type contact, which acts to significantly improve the heat transfer between the epitaxial layer 112 and a heat sink in contact with the metal contact 142.

Figure 8:
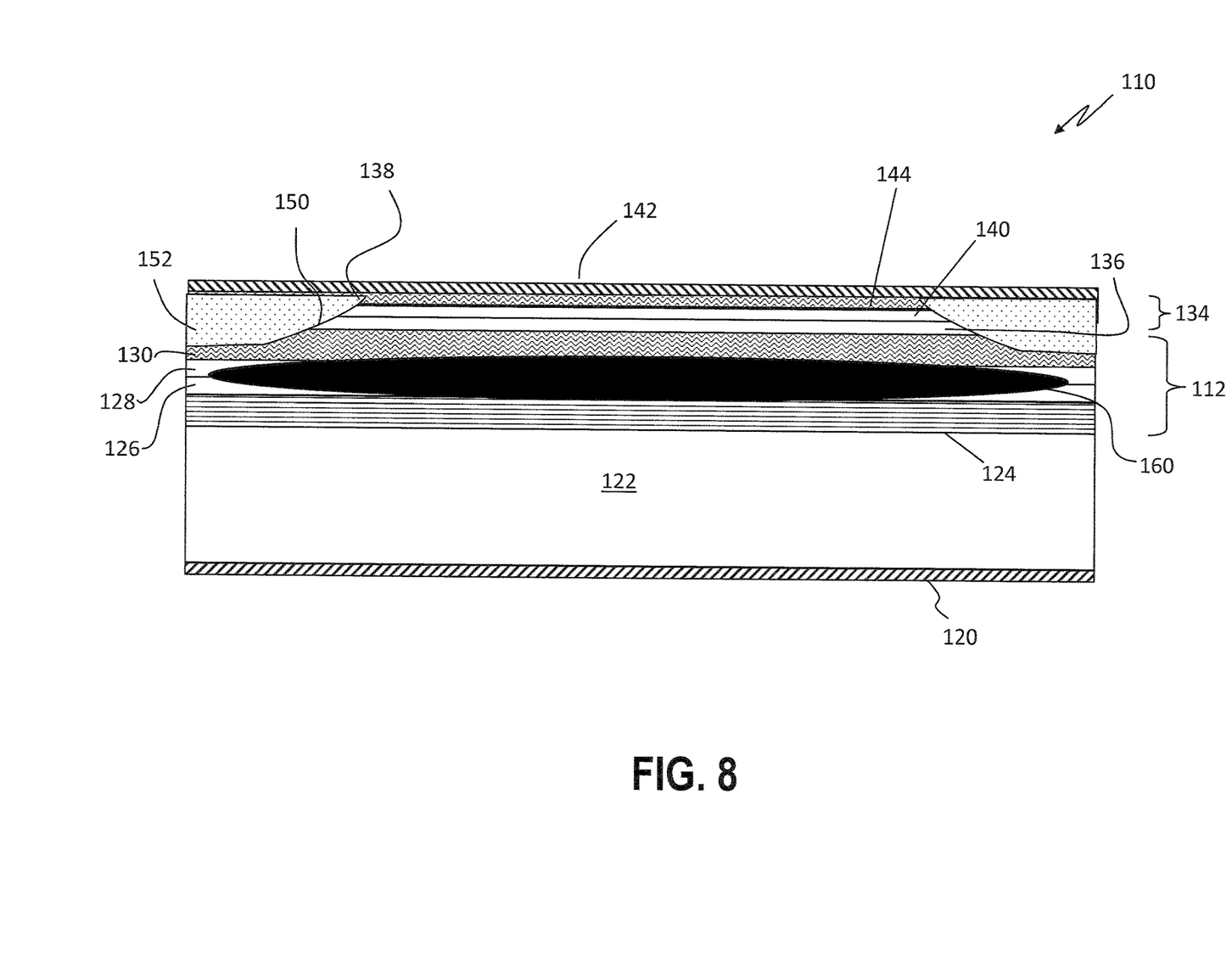
FIG. 8 is a detailed cross-sectional view diagram of the semiconductor implemented as a laser diode having a tunnel junction of FIG. 7 with features defining the lateral waveguide, in accordance with the first exemplary embodiment of the present disclosure.

FIG. 8 is a detailed cross-sectional view diagram of the semiconductor 110 implemented as a laser diode having a tunnel junction of FIG. 7 with features defining the lateral waveguide, in accordance with the first exemplary embodiment of the present disclosure. With reference to FIGS. 7-8, lasing operations require that light generated in the active region 132 be guided in both the vertical and lateral dimensions. Lateral guiding can be achieved by limiting the lateral extent of the current flow by etching a mesa 150 into the semiconductor 110. The lateral waveguide may be defined by the etched mesa 150 using standard wet chemical processing and photolithography. An electrically insulating layer 152 or an oxide layer helps confine the current to the lateral waveguide, thereby improving electrical to optical conversion efficiency. The mesa structure 150 also guides the optical power 160 which facilitates coupling of the emitted light at the output facet and improves electrical to optical conversion efficiency. The insulating layer 162 may typically have lower thermal conductivity than the epitaxial layers 112 and metal contact 142 so heat flows predominantly through the metal contact 142.

Figure 9:
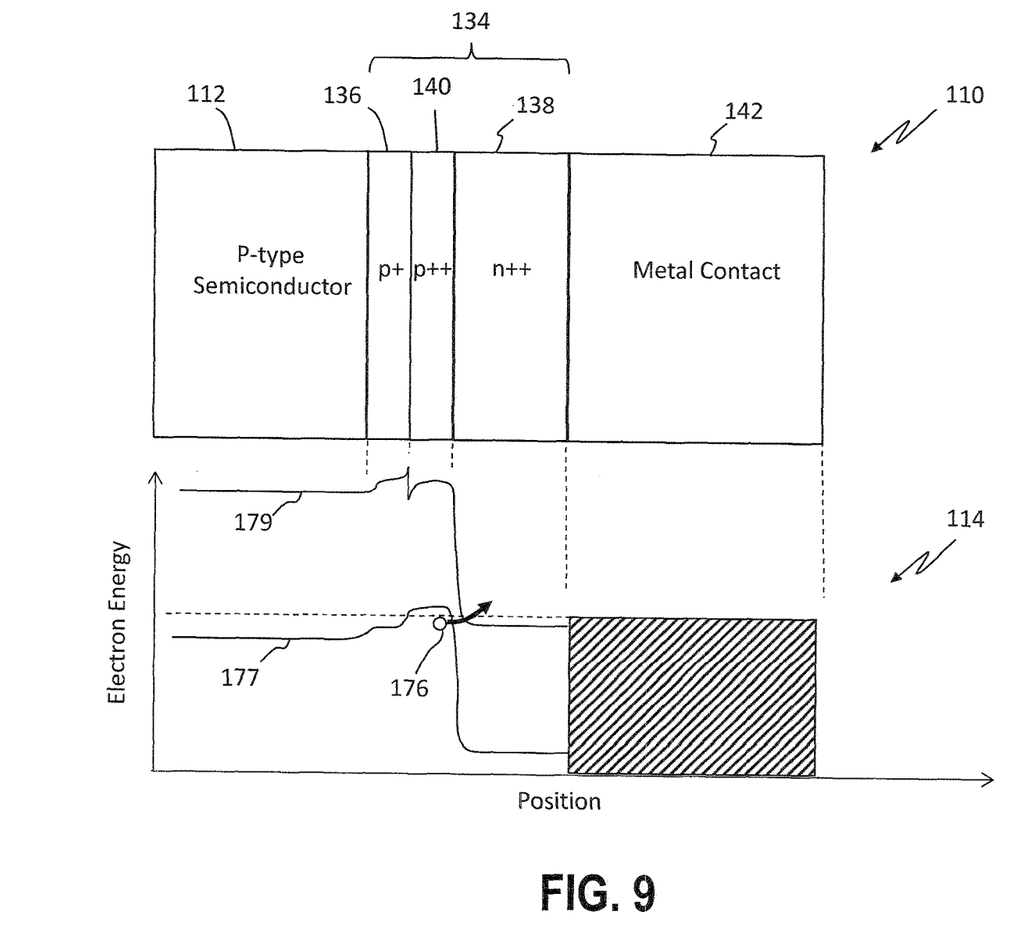
FIG. 9 is a schematic diagram of layers of the semiconductor implemented as a laser diode having a tunnel junction of FIGS. 7-8 and the corresponding energy band alignment for the contact from the epitaxial layers of the p-type semiconductor to the tunnel junction and contact metal, in accordance with the first exemplary embodiment of the present disclosure.

FIG. 9 is a schematic diagram of layers of the semiconductor 110 implemented as a laser diode having a tunnel junction of FIGS. 7-8 and the corresponding energy band alignment for the contact from the epitaxial layers 112 of the p-type semiconductor to the tunnel junction 134 and contact metal 142, in accordance with the first exemplary embodiment of the present disclosure. In particular, FIG. 9 illustrates the detailed layers of p-type and n-type semiconductor 136, 138 through the reverse biased tunnel junction 134 which is facilitated by the thin, very heavily doped p++ layer 140, which is used to improve heat flow from the epitaxial layers 112 of the semiconductor to the metal contact 142. A graph 114 is shown in alignment to the specific layers of the semiconductor 110 to depict the corresponding energy levels of the conduction band 179 and valence band 177. Current transport occurs as electrons 176 tunnel from the heavily doped p++ region 140 to the heavily doped n++ semiconductor 138, as indicated by the arrow in graph 114. The tunnel junction 134 does not present a thermal barrier since the thermal transport mechanisms on both sides of the tunnel junction 134 are identical and electrical current flows between the contact 142 and n++ semiconductor 138 through the alloy junction between the metal contact 142 and the heavily doped n-type semiconductor 138. In contrast to the conventional p-type contact, as discussed relative to FIGS. 1-6, the alloyed junction within the semiconductor 110 does not present a thermal barrier for heat transport. Therefore, the thermal barrier due the p-type contact of conventional semiconductors no longer limits heat transport from the semiconductor.

Figure 10:
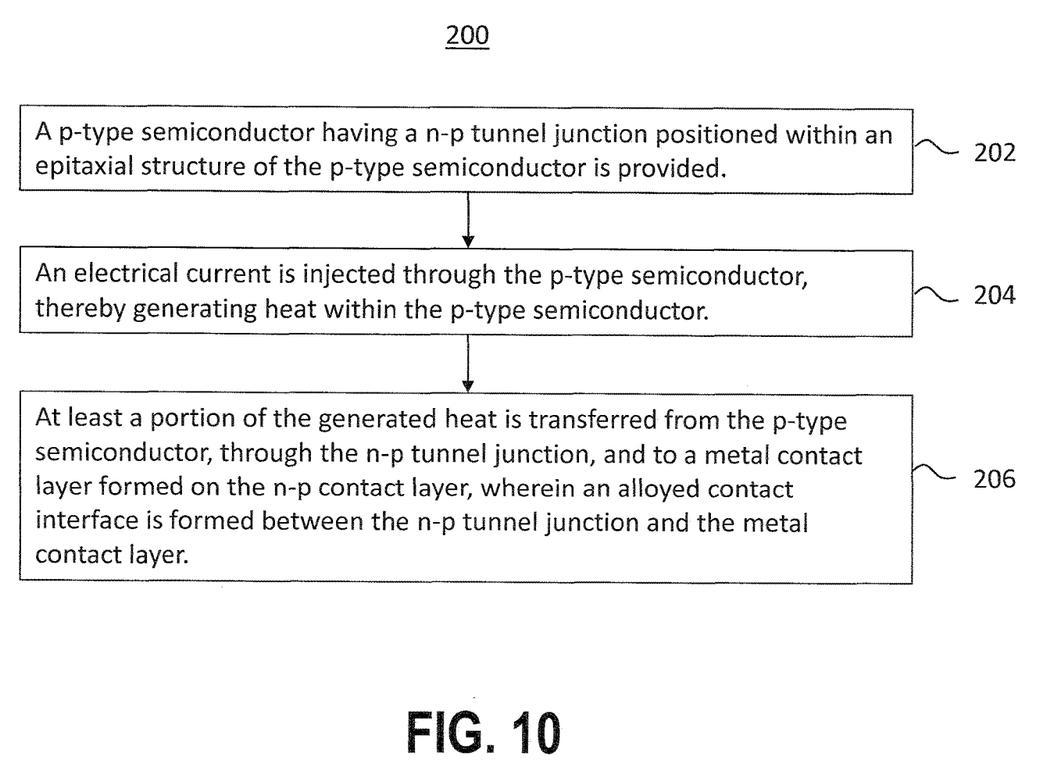
FIG. 10 is a flowchart illustrating a method of heat removal from a high powered semiconductor device, in accordance with the first exemplary embodiment of the disclosure.

FIG. 10 is a flowchart 200 illustrating a method of heat removal from a high powered semiconductor device, in accordance with the first exemplary embodiment of the disclosure. It should be noted that any process descriptions or blocks in flow charts should be understood as representing modules, segments, portions of code, or steps that include one or more instructions for implementing specific logical functions in the process, and alternate implementations are included within the scope of the present disclosure in which functions may be executed out of order from that shown or discussed, including substantially concurrently or in reverse order, depending on the functionality involved, as would be understood by those reasonably skilled in the art of the present disclosure.

As is shown by block 202, a p-type semiconductor having an n-p tunnel junction positioned within an epitaxial structure of the p-type semiconductor is provided. An electrical current is injected through the p-type semiconductor, thereby generating heat within the p-type semiconductor (block 204). At least a portion of the generated heat is transferred from the p-type semiconductor, through the n-p tunnel junction, and to a metal contact layer formed on the n-p contact layer, wherein an alloyed contact interface is formed between the n-p tunnel junction and the metal contact layer (block 206). Many additional steps, features, and functions may be included in the method, including any of the steps, features, and functions disclosed elsewhere within this disclosure, all of which are considered within the scope of the disclosed method.

It should be emphasized that the above-described embodiments of the present disclosure, particularly, any "preferred" embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A semiconductor apparatus comprising:
   a p-type semiconductor;
   a reversed-biased tunnel junction positioned within an epitaxial structure of the p-type semiconductor;
   wherein the reversed-biased tunnel junction comprises:
     a p+ layer;
     a heavily doped n++ layer; and
     a thin, very heavily doped p++ layer positioned between the p+ layer and the heavily doped n++ layer; and
   wherein the epitaxial structure comprises:
     an n-type guide layer;
     a p-type guide layer in contact with the n-type guide layer;

an n-cladding layer formed in contact with the n-type layer; and
a p-cladding layer formed in contact with the p-type layer,
a metal contact layer connected to the reversed-biased tunnel junction through an alloyed n-type contact interface;
wherein the alloyed n-type contact interface is in direct contact with the heavily doped n++ layer of the reversed-biased tunnel junction;
wherein the p-cladding layer is in direct contact with the p+ layer of the reversed-biased tunnel junction; and
wherein a current injected into the semiconductor apparatus has a flow direction from the p+ layer, through the thin, very heavily doped p++ layer, through the heavily doped n++ layer, and into the metal contact layer, wherein a quantity of heat generated by the current is transferred from the p+ layer, through the thin, very heavily doped p++ layer, through the heavily doped n++ layer, and into the metal contact layer.

2. The semiconductor apparatus of claim 1, wherein the thin, very heavily doped p++ layer has a lower bandgap than the p+ layer.

3. The semiconductor apparatus of claim 1, wherein the alloyed n-type contact interface has a lower thermal and electrical resistance than a metallurgically abrupt interface of a p-type contact.

4. The semiconductor apparatus of claim 1, further comprising at least one of: a spacer and a heat sink connected to the metal contact layer.

5. A laser diode apparatus comprising:
n-type and p-type waveguide layers having an active layer therebetween;
a reversed-biased tunnel junction formed on a p-side of the n-type and p-type waveguide layers, the reversed-biased tunnel junction comprising:
a p+ layer;
a heavily doped n++ layer; and
a thin, very heavily doped p++ layer positioned between the p+ layer and the heavily doped n++ layer;
a metal contact layer in contact with the reversed-biased tunnel junction, wherein an alloyed contact interface is formed between the reversed-biased tunnel junction and the metal contact layer, and
wherein the alloyed contact interface is in direct contact with the heavily doped n++ layer of the reversed-biased tunnel junction;
an n-cladding layer formed in contact with the n-type waveguide layer and a p-cladding layer formed between with the p-type waveguide layer and the reversed-biased tunnel junction,
wherein the p-cladding layer is in direct contact with the p+ layer of the reversed-biased tunnel junction; and
wherein a current injected into the laser diode apparatus has a flow direction from the p+ layer, through the thin, very heavily doped p++ layer, through the heavily doped n++ layer, and into the metal contact layer, wherein a quantity of heat generated by the current is transferred from the p+ layer, through the thin, very heavily doped p++ layer, through the heavily doped n++ layer, and into the metal contact layer.

6. The laser diode apparatus of claim 5, wherein the thin, very heavily doped p++ layer has a lower bandgap than the p+ layer.

7. The laser diode apparatus of claim 5, wherein the alloyed contact interface is an alloyed n-type contact interface.

8. The laser diode apparatus of claim 7, wherein the alloyed n-type contact interface has a lower thermal and electrical resistance than a metallurgically abrupt interface of a p-type contact.

9. The laser diode apparatus of claim 5, wherein, when an electrical current is injected in the n-type and p-type waveguide layers, the active layer provides optical gain by stimulated emission, wherein the injected electrical current is converted to coherent optical power.

10. The laser diode apparatus of claim 5, further comprising at least one of: a spacer and a heat sink connected to the metal contact layer.

11. A method of heat removal from a high powered semiconductor device, the method comprising the steps of:
providing a p-type semiconductor having a reversed-biased tunnel junction positioned within an epitaxial structure of the p-type semiconductor;
wherein the reversed-biased tunnel junction comprises:
a p+ layer;
a heavily doped n++ layer; and
a thin, very heavily doped p++ layer positioned between the p+ layer and the heavily doped n++ layer; and
wherein the epitaxial structure comprises:
an n-type guide layer;
a p-type guide layer in contact with the n-type guide layer;
an n-cladding layer formed in contact with the n-type layer; and
a p-cladding layer formed in contact with the p-type layer,
injecting an electrical current through the p-type semiconductor, thereby generating heat within the p-type semiconductor, wherein the injected electrical current has a flow direction from the p+ layer, through the thin, very heavily doped p++ layer, through the heavily doped n++ layer, and into a metal contact layer; and
transferring at least a portion of the generated heat from the p-type semiconductor, through the reversed-biased tunnel junction, wherein the portion of the generated heat is transferred from the p+ layer, through the thin, very heavily doped p++ layer, through the heavily doped n++ layer, and into the metal contact layer formed on the reversed-biased tunnel junction, wherein an alloyed contact interface is formed between the reversed-biased tunnel junction and the metal contact layer, and wherein the alloyed n-type contact interface is in direct contact with the heavily doped n++ layer of the reversed-biased tunnel junction, and wherein the p-cladding layer is in direct contact with the p+ layer of the reversed-biased tunnel junction.

12. The method of claim 11, further comprising conducting the heat transferred to the metal contact layer to at least one of: a spacer and a heat sink.

* * * * *